United States Patent [19]

Löb

[11] Patent Number: 5,036,252
[45] Date of Patent: Jul. 30, 1991

[54] RADIO FREQUENCY ION BEAM SOURCE

[75] Inventor: Horst Löb, Giessen, Fed. Rep. of Germany

[73] Assignee: Hauzer Holding BV, Venlo, Netherlands

[21] Appl. No.: 342,220

[22] Filed: Apr. 24, 1989

[30] Foreign Application Priority Data

Apr. 26, 1988 [DE] Fed. Rep. of Germany ....... 3814053

[51] Int. Cl.$^5$ ............................................. H01J 27/16
[52] U.S. Cl. ......................... 315/111.31; 315/111.21;
315/111.41; 315/111.51; 315/111.81;
313/231.31; 250/423 R
[58] Field of Search ...................... 315/111.21, 111.31,
315/111.41, 111.51, 111.81; 313/231.31;
250/396 R, 396 ML, 423 R, 492.3

[56] References Cited

U.S. PATENT DOCUMENTS

| | | | |
|---|---|---|---|
| 4,521,719 | 6/1985 | Liebel | 315/111.81 |
| 4,697,085 | 9/1987 | Magee et al. | 315/111.81 X |
| 4,782,304 | 11/1988 | Aitken | 250/423 R X |
| 4,812,166 | 3/1989 | Saiki et al. | 315/111.51 X |
| 4,851,668 | 7/1989 | Ohno et al. | 250/423 R X |
| 4,857,809 | 8/1989 | Torii et al. | 315/111.31 |
| 4,870,284 | 9/1989 | Hashimoto et al. | 315/111.81 X |
| 4,886,969 | 12/1989 | Knauer | 315/111.81 X |
| 4,937,456 | 6/1990 | Grim et al. | 315/111.81 X |

OTHER PUBLICATIONS

W. F. DiVergilio, et al, "Development of Radio Frequency Induction Plasma Generators for Neutral Beams," Review of Scientific Instruments, Jul. 1986, pp. 1254–1260.

Patent Abstracts of Japan, Aug. 14, 1986, Toshiba Corporation, vol. 10, No. 234 (M-507) 2290.

*Primary Examiner*—Eugene R. LaRoche
*Assistant Examiner*—Do Hyun Yoo
*Attorney, Agent, or Firm*—Townsend and Townsend

[57] ABSTRACT

A monoenergetic ion source for the generation of an ion beam is described with the ion energies which lie below 100 eV and also above 5 keV being capable of being freely selected so that the whole range of intermediate energies and independently of the selected ion current density with the aid of the operating parameters of the source. The ion current density is so freely adjustable independently of the ion energy. The ion source is provided with an optical beam focussing system and can in particular also be used to produce metal ions. This ion source also makes a special coating process possible which is likewise described here.

38 Claims, 4 Drawing Sheets

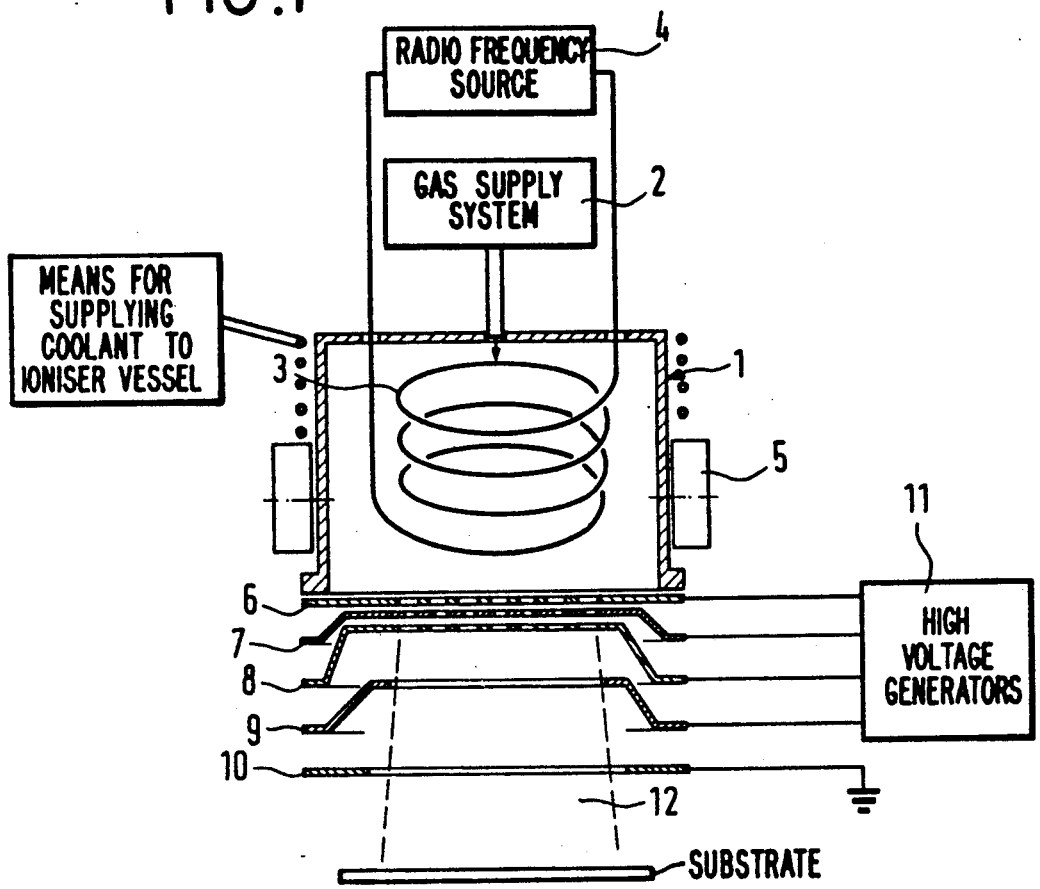
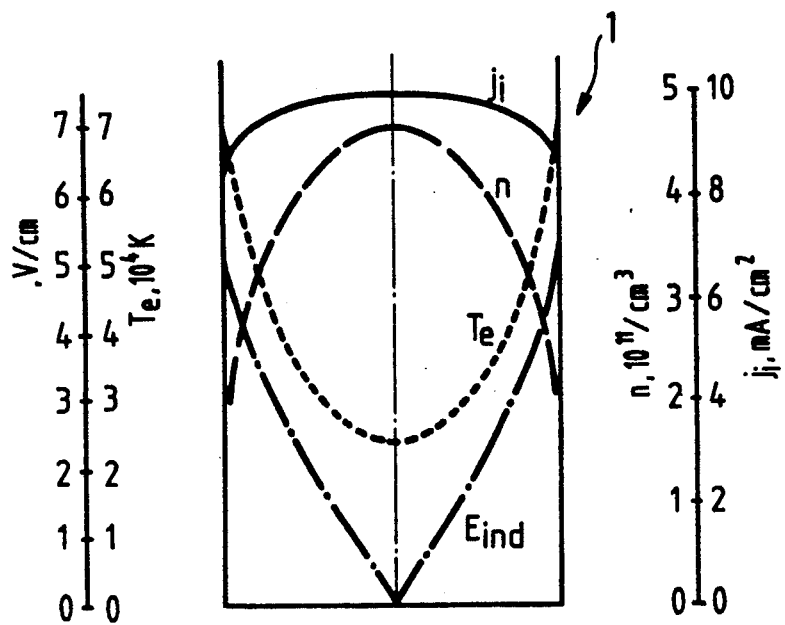

RADIO FREQUENCY ION BEAM SOURCE

BACKGROUND OF THE INVENTION

The invention relates to a radio frequency ion beam source comprising an ioniser vessel which can be charged with the particular working gas to be ionised, in particular, gaseous, condensable metal vapours and metal compounds; a coil connected to a radio frequency source for generating a plasma in the ioniser vessel, with the plasma arising through inductively stimulated discharge; and also a beam forming system with several extraction grids.

The technology of surface treatment and in particular the manufacture of thin layers has become very significant in recent years, particularly with regard to the industrial application of such processes. There are nowadays numerous processes for the manufacture or preparation of thin layers and for the treatment of material surfaces. They all require either reduced pressure or vacuum in the processing chamber and are thus carried out in vacuum systems.

Some very well known processes relate to vaporisation by Joule heating in furnaces, boats, crucibles etc. either by electric heating or by electronic or ion bombardment. Other processes use vaporisation produced by means of an anodic or cathodic arc or also by eddy current heating of conductive material in an induced AC field. Mention should also be made of large area sublimation on cathodes using various cathode sputtering arrangements with and without magnetic enhancement of the ionisation in the DC or AC glow discharge.

The known and customary vaporisation sources deliver atoms and ions for the condensation on the substrate which have a broad distribution of kinetic energies of the particles. This is a problem because the highly energetic particles cause damage rather than the generally desired uniform condensation, which results in faultfree crystal growth. The damage caused can take the form of crystal splitting, crystal destruction or decomposition of the surface, in a similar form to cathode sputtering. On the other hand the incident particles of low energy frequently do not attain the required kinetic energy at the surface for an orderly incorporation into a crystal grid.

These energies are frequently not sufficient in order to obtain the desired bond strength of the coating in the boundary surface between the substrate and the layer. In some cases a high energy of the particles is required in the coating beam in order to increase the surface energy of the substrate, when the substrate temperature has to be kept low for certain reasons, or when the heat exchange between the substrate and the uppermost condensation plane is deficient.

Radio frequency ion sources of the initially named kind are also known (see EP-A No. 2 0 261 338 and DE-A No. 1 37 08 716) in which the r.f. coil is arranged outside of the respective ioniser vessel and specially formed ion extraction systems are used. Such ion beam sources make it possible to generate only simply charged ions, i.e. only a single monoenergetic beam peak, can also be used with reactive gases, have a robust and simple construction and also a simple supply regulation unit, they are also able to satisfy the practical requirement placed on operational reliability and working life.

It is however not possible with the known radio frequency ion beam sources to satisfy the requirements which arise in practice for intensive beams of variable ion energy right down to extremely low values, and in particular the requirement to also generate metal ions.

SUMMARY OF THE INVENTION

The object of the invention is thus in particular to develop a radio frequency ion beam source of the initially named kind so that, with an extensively monoenergetic energy distribution of the ions, both the ion energy and also the ion flux density can be continuously and extremely sensitively varied in a large range, and above all, so that intensive metal ion beams of very low energy can be generated. Beam divergence should be avoided, or at least substantially avoided.

This object is satisfied in accordance with the invention in that the radio frequency coil which brings about an automatic ring discharge and serves to generate a non-isothermal plasma of ions, electrons and neutral gas particles is coaxially arranged in the interior of the ioniser vessel; in that the ioniser vessel is formed as a metallic conductive vessel; and in that the beam forming system comprises a combination of multi-hole extraction grids and an ion focussing unit which directly follows them and which can in particular be selectively switched on.

The arrangement of the r.f. coil in the interior of the ioniser vessel, and the use of a metallic ioniser vessel, results not only in a very rigid arrangement having an overall robust and price-worthy construction, but above all also makes it possible to generate metal ions. This is possible since the danger which arises with the known quartz vessels with outwardly disposed r.f. coils is no longer present, namely that the dissociated conducting substances deposit on the internal wall of the quartz vessel, form a conductive coating and then screen the r.f. energy against penetration into the discharge plasma.

Through the beam formation system of the invention in the form of a combination of multi-hole extraction grids and an ion focussing unit which directly follows the latter, which can operate on an ion optical, electrostatic, magnetostatic or electromagnetic basis, and which can in particular be selectively switched in, it is ensured that continuously selectable ion current densities can be ensured in a large range, in particular to the range from less than 1 mA/cm$^2$ to more than 10 mA/cm$^2$ with approximately monoenergetic and continuously variable ion energy, in particular between approximately 10 eV and 3 keV, and indeed also with independently adjustable and high current densities. The radio frequency ion beam source in accordance with the invention is usable for a wide range of ions including metal ions from gaseous metal compounds and ions of reactive gases. It is characterised by a long working life and long intervals between services.

The ioniser vessel preferably consists of a chemically resistant, stainless and non-magnetic steel and can be provided with liquid cooling, for example water cooling.

The r.f. coil preferably consists of a non-magnetic electrically well conducting metal tube coil through which coolant liquid flows, with the copper tube coil being coated, in view of the high plasma conductivity and the differential r.f. voltages along the coil, with an insulating layer, for example in the form of a woven quartz fibre cover or a glass coating.

The ioniser vessel is provided at one end with a cover and at the other end with a mounting flange. The ion source can be externally flanged via this mounting flange onto the associated vacuum chamber in which there prevails a pressure of $10^{-4}$ to $10^{-8}$ Torr for example.

Insulators for the passage of the coil connections through the cover are provided in or on the cover and permit the supply of r.f. power to the coil. The gas inlet is also present in the cover, which is preferably formed in one piece with the container. Inwardly disposed screens are preferably used in the ioniser vessel to prevent metal being deposited on the insulators for the coil connections.

A ring of permanent magnets of alternating polarity is mounted on the metallic outer jacket of the ioniser vessel centrally relative to the ioniser vessel and the coil, to reduce discharge losses at the wall of the ioniser vessel. For a given r.f. power the plasma density and the beam density can be increased in this way since a "Cusp field arrangement" of this kind greatly reduces the plasma current losses at the wall of the ioniser, and with a suitable arrangement of these permanent magnets, the plasma is moreover concentrated via the extraction openings.

The extraction grid provided in accordance with the invention preferably forms a multi-hole three grid extraction system, the first grid electrode of which is connected with the metallic ioniser vessel. The thickness dimensions of the individual, mutually insulated, grid electrodes and their mutual spacings are very small and preferably substantially smaller than 1 mm. A central support is usefully provided to ensure precise spacing of the grid electrodes and also to restrict thermal bending deflections of the grids.

The ion focussing unit provided in accordance with the invention, which is in particular switched on at low ion energies and conjointly at high current densities, preferably consists of an ion optical focussing lens which is formed by the third grid electrode and two ring electrodes. The two ring electrodes preferably lie on an imaginary conical surface, in particular a conical surface which diverges away from the ioniser vessel and has an included angle of 30°.

In accordance with an embodiment of the invention a beam neutraliser having a glow filament coil can also be provided in the region of the preferably earthed source output, or inside the ion lens. The beam neutraliser is advantageously used with insulating targets, or at least with targets having an insulating surface to additionally reduce the space charge broadening of the ion beam at low energies.

In addition, a magnetic lens with a field strength matched to the ion energy can be provided in the region of the source outlet to assist the bundling of the beam.

In connection with a method for operating the ion beam source in accordance with the invention it is advantageously possible to vary the current density, which depends on the r.f. power and/or on the extraction voltage, and the ion energy independently from one another. In this way it is possible to ideally satisfy the most diverse and also most difficult tasks which arise in practice.

These tasks can be explained in the following manner. The energies and current densities of the ions which impinge on the substrates and must namely be selected and optimised for the layer quality which is desired for the particular material. This has the following reasons:

It is often necessary for the growth of a specific crystal orientation to specify both the minimum and also the maximum energy of the arrival of the ions. Many crystals are for example built up endothermically with their build-up frequently being directionally dependent on the supply of energy and thermal dissipation. Moreover, the crystallite form, which can appear as round lumps, long needles, columns or slate-like platelets depends during growth on the energy of the incident ions and atoms.

Furthermore, the ion current density or atom current density incident on the substrate has a large influence on the overall crystallite texture and thus also on the growth rate of the total layer. Both the ion current density and the ion energy must be individually optimised for each kind of material and layer quality, which is made possible by the ion beam source of the invention.

In forming a well bonded boundary layer between the substrate and the actual layer one often operates at high ion energies in order to obtain a kind of ion implantation and thus a particular anchoring of the intended layer in the substrate. The ion implantation results in atoms being incorporated both between the crystallites and also within the crystallites (interstitially) up to a depth of several atomic planes in the crystals of the substrate. In so doing a diffusion exchange of the arriving atoms with the atoms of the crystallite is simultaneously made possible. This leads for example to solid solutions, mixed crystals and for instance intermetallic compounds.

All the aforementioned is made possible by the use of the ion beam source of the invention in sequential continuous method steps, without interruption, in the same vacuum plant and at the same position. Thus several method steps, such as surface cleaning by means of cathode sputtering or ion beam etching through ions of high energy and then the build-up of a well bonded boundary layer and finally the build-up of the desired layer can be carried out as mentioned above without interruption and with the same ion beam source.

By way of example the method steps can comprise combinations of at least some of the following method steps:
(a) the substrate surface is cleaned and partially eroded by ion beam etching with appropriately chosen ion energy and ion current density,
(b) the substrate surface is heated and degassed by means of an ion beam of low ion energy and high current density ($>1$ mA/cm$^2$),
(c) the substrate surface is made rough by means of craters and grooves for the purpose of good mechanical anchoring of the desired layer,
(d) ions of higher energy ($>50$ keV), the beam being of low current density, are shot into the substrate (are implanted) such that the ions penetrate some atomic planes deep into crystallites (crystal grains), in particular into the spaces between crystal atoms (interstitial) and even into the interspace of the crystallites (inter grain), thus initiating of interdiffusion of atoms, whereby the implantation of ions produces solid solutions of the penetrating ions, mixed crystallisation and, for instance, intermetallic compounds with the material of the substrate,
(e) layers of metals, alloys or compounds are built up on the surface of the substrate with the optimum ion energy and optimum ion beam density necessary for each crystallite texture and crystallite shape, and (f) layers of metals, alloys or compounds are built up with the optimum ion energy and optimum ion current density necessary for each crystal structure and crystal orientation.

In order to explain this possibility further the abovementioned method steps (a), (b), (d) and (f) can for example be used to apply hard metal or ceramic layers onto an inorganic substrate. In contrast a combination of the steps (a), (b), (c), (e) and (f) is suitable for the application of metal layers onto modern plastics, for example a layer of gold on polytetrafluoroethylene. The method of the invention is also entirely suitable for the coating of semiconductors, for example for applying contacts to semiconductors based on gallium arsenide. For this a combination of the abovementioned method steps (a), (b), (e) and (f) is suitable.

It is also particularly important that one can use ion sources with suitable ion current densities and ion energies to produce or to deposit on substrates, alloys and compounds which may for example also include alloys of a complex nature.

It should also be mentioned that a further magnetic post focussing can be effected in the process chamber in order to counteract the tendency of the ions to diverge, in particular at low ion energies. That is to say a magnetic post focussing is effected, or a corresponding device is arranged, in the process chamber between the ion radiation source and the substrate. This post focussing device is particularly useful when the ion energy falls below about 500 eV.

Further advantageous features and developments of the invention are set forth in the subordinate claims.

BRIEF DESCRIPTION OF THE DRAWINGS

The invention will now be explained in more detail with reference to the drawings, in which are shown:

FIG. 1 a schematic representation of a radio frequency ion beam source in accordance with the invention for the production of coatings on substrates and for the processing of material surfaces, FIG. 2 a diagram of typical values of discharge and plasma data with regard to their radial course in a radio frequency ion beam source in accordance with FIG. 1, FIG. 3 a schematic representation to explain the formation by extraction of part of an ion beam from the plasma of a radio frequency ion beam source in accordance with FIG. 1, by means of a three grid electrode system, FIG. 4 a diagram of the extractable total ion current of the extraction system of FIG. 3, FIG. 5 a sectional representation of a practical embodiment of a radio frequency ion beam source in accordance with the invention, FIG. 6 a part illustration of an additional magnetic focussing device for use with an ion beam source in accordance with FIG. 5 for very low ion energies, FIG. 7 a diagram of typical discharge characteristics of an ion beam source in accordance with FIG. 5, and FIG. 8 a diagram of the required extraction voltage of the grid system of an ion beam source in accordance with FIG. 5 for argon as a function of the current density and of the extracted ion current.

DESCRIPTION OF THE PREFERRED EMBODIMENT

Figure 3:
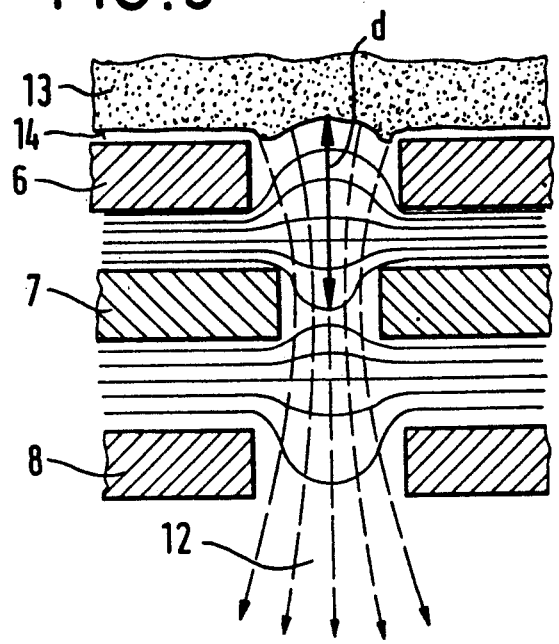

As seen in FIG. 1 a high frequency ion beam source comprises a metallic ioniser vessel 1 with an associated gas supply system 2, a radio frequency coil 3 arranged inside the ioniser vessel 1 and having an associated radio frequency generator 4, and also a beam formation system which comprises three grid electrodes 6, 7, 8 and two ring electrodes 9, 10 which belong to an ion lens.

The grid electrodes and/or ring electrodes are connected to high voltage generators 11. The ioniser vessel is surrounded by permanent magnets in a specific arrangement 5.

The working gases which flow in from the gas supply system 2 are ionised in the ioniser vessel, i.e. split up into positive ions and electrons and thus a plasma state is created.

The discharge power required for an inductive, radio frequency and automatic ring discharge is generated by the r.f. generator which preferably operates in the frequency range form 0.5 to 30 MHz and is coupled in via the induction coil 3. This causes first of all a high frequency axial magnetic field in the interior of the coil which generates, by induction, an electrical eddy field with closed field lines of the same frequency. In this eddy field discharge electrons are accelerated on approximately circular paths until they are able to cause new ionisation impacts. Through the cooperation of elastic central collisions with direction reversal and the change of direction of the radio frequency azimuthal electric field the electrons affected hereby can rapidly accumulate energy. By optimum matching of the generator frequency, the discharge pressure and the circumference of the ioniser vessel, this accumulation process can be favourably influenced from a statistical viewpoint. The length of the ioniser vessel can also be optimised in dependence on the vessel radius and the ion mass in order to obtain maximum ion yields.

As the ionising electrons are created from previous ionisation acts an independent gas discharge is present which does not require any glowing cathodes to feed it. This leads to the high degree of reliability and to the long life of the radio frequency discharges, in particular also when operating with reactive gases.

The ignition of the r.f. discharge takes place either automatically by a high voltage pulse at an adequately high operating pressure or by a short metered pressure surge at low gas pressure. The build-up time of the r.f. discharge amounts to around only 30 $\mu$s which is a further advantage which is important for many applications. The r.f. discharge generates a non-isothermal plasma comprising ions, electrons and neutral gas particles.

As can be seen from FIG. 2 the electron temperature $T_e$ reaches some $10^4$K while ion temperature and in particular the neutral particle temperature, lies only a little above room temperature. This also simplifies the cooling of the whole ioniser.

A further advantage of the r.f. discharge is the approximately pure Maxwell distribution of the plasma electrons and this signifies that on a quantitative basis douple-ions hardly occur and thus that the desired homogeneity of the energy is not disturbed by particles of double or multiple energy. As a result of the induction law the electrical eddy field strength Eind is zero at the axis of the ioniser and rises towards the radius of the coil and this course is amplified further by the skin effect. As a consequence of this the electron temperature $T_e$ rises rapidly towards the outside as is shown in FIG. 2.

The plasma density n, however, decreases towards the edge and indeed in consequence of the charge carrier movement with subsequent ion-electron recombination.

As the extractable beam current density is proportional to n. $T_e$ both effects hereby approximately cancel one another, so that the high frequency ion beam source has the desired homogenous beam profile. As the plasma density n, and thus also the extractable current density, increase linearly with the power of the r.f. generator the achievable ion density is only restricted by the extraction system and by the maximum operating temperature of the ion beam source which is provided with a cooling means.

The system shown in FIG. 1 for the formation of the ion beam 12 has the task of extracting the plasma ions from the ioniser, of accelerating them and of focussing them into the beam 12. In order to also fulfil this task for beam voltages or ion energies far below 100 V the radio frequency ion beam source of the invention is provided with a combination of multi-hole extraction grids and an ion optic focussing unit.

All the grid and ring electrodes 6, 7, 8, 9, 10 which belong to this beam formation system, as shown schematically in FIG. 1, comprise preferably molybdenum, stainless steel or the like as low thermal coefficient expansion and high temperature stability is required of these electrodes. The individual electrodes are connected to corresponding high voltage sources.

The first grid electrode, which can also be termed an extraction anode lies at a positive potential of approximately 10 to 3000 V, is electrically and thermally conductingly connected to the ioniser vessel 1, which acts as an anode in operation, and determines, together with the last electrode 10 which is held at earth potential, the beam voltage or the ion energy (10 to 3000 eV).

The second grid electrode 7, which can be termed an extraction cathode, is negatively biased at a level which is just sufficiently high that the potential difference from the first grid electrode 6 delivers the desired current density which depends on the ideal extraction voltage. The spacing of the plasma bounding surface 14 from the second grid electrode as indicated in FIG. 3 hereby represents the acceleration path d of the ions taking account of the bending of the equipotential lines (see FIG. 3). The third grid electrode 8 which is to be termed a retarding electrode does not have to be earthed. It simultaneously acts as the first electrode of the ion lens which is inserted after the extraction path and has a freely selectable potential.

The first ring electrode 9 represents the central electrode of the ion lens and its potential must be ideally matched to the desired values of the beam current and beam voltage.

The second ring electrode 10 lies at earth potential and terminates the ion lens and also the entire beam forming system.

FIG. 3 shows the potential distribution and the ion tracks for a partial beam (single hole arrangement) within the three grid electrodes 6, 7, 8. The plasma ions are picked up by the extraction field between the first two electrodes 6, 7 and accelerated towards the openings of the second grid electrode 7 (extraction cathode) while the plasma electrons are held back, so that a positive space charge arises within the extraction range. The boundary between the neutral plasma of the r.f. discharge and the positive space charge zone is termed the plasma boundary 14 and acts as an ion emitter or "virtual anode".

When a specific ion energy and at the same time a defined current density is required then this can substantially always be achieved by adjusting the two first grid potentials $U_+ - U$ and $U_+ - U_- - U_{ex}$.

The desired beam voltage U normally lies beneath the required dependent extraction voltage which is dependent on the desired current density. In this case one uses the so-called acceleration-deceleration technique and slows the ions between the second grid electrode 7 and the third grid electrode 8 down to the desired U-value. The total extracted ion current results from the product of the current density in an individual extraction bore, the number of the extraction bores and the cross-sectional area of each individual bore. The current density at the substrate to be irradiated then follows from the current, related to the beam cross-section at the location of the substrate. In order to keep the discharge plasma in the r.f. ioniser quasi neutral, it is necessary to extract from the latter a number of plasma electrons equivalent to the extracted ion current. This automatically takes place by the first grid electrode 6 which acts as the extraction anode, which is positively biased, and above all by the metallic ioniser vessel 1 which is connected to the latter. The discharge plasma automatically adopts a potential relative to the ioniser vessel which is approximately 10 V above that of the extraction anode 6.

The beam forming system not only has the task of extracting a desired ion current and accelerating it to the desired voltage but also to focus it to a beam which diverges as little as possible. Within certain limits a focussing of the individual part beams already takes place within the three grid electrodes 6, 7, 8, as shown by FIG. 3.

This is a consequence of the fact that at an adequately high extraction voltage, which depends on the discharge power, the plasma boundary arches upwardly in concave mirror-like form so that all equipotential surfaces in the upper part of the acceleration path are also correspondingly arched, and thus an ion optic immersion lens arises which brings about a waisting of the partial beams. As a consequence of this it is possible to make the bores in the second grid electrode 7 smaller and thus to reduce the neutral gas loss, which makes it possible to improve the gas economy of the ion source.

Figure 4:
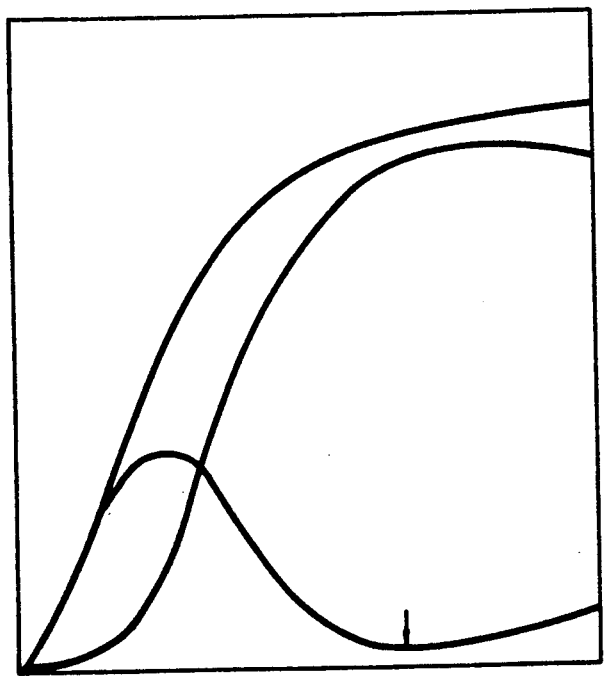

The diagrammatic illustration of FIG. 4 shows the extractable total ion current of a three grid extraction system in accordance with FIG. 3, the current loss to the second grid electrode 7 and the extracted current as a function of the extraction voltage. If the plasma density in the ioniser and the extraction voltage are precisely matched to one another, and if thus the so-called "ideally focussed case" is present, then the focal points of the partial beams lie precisely at the center of the bores of the second grid electrode 7. The loss current at this grid electrode 7, which represent an extraction cathode, thereby reaches a minimum. If the extraction voltage is too large or too small then the focal length of the lens lies below or above acceleration distance whereby the loss current grows and power losses and sputtering damage increase. In order to satisfy the requirements for very low ion energies at the same time as high beam current densities, and thereby to simultaneously avoid beam broadening effects, an ion focussing lens is arranged, in accordance with the invention, after the grid electrode system and comprises the third grid electrode 8 and the two ring electrodes 9, 10.

Figure 5:
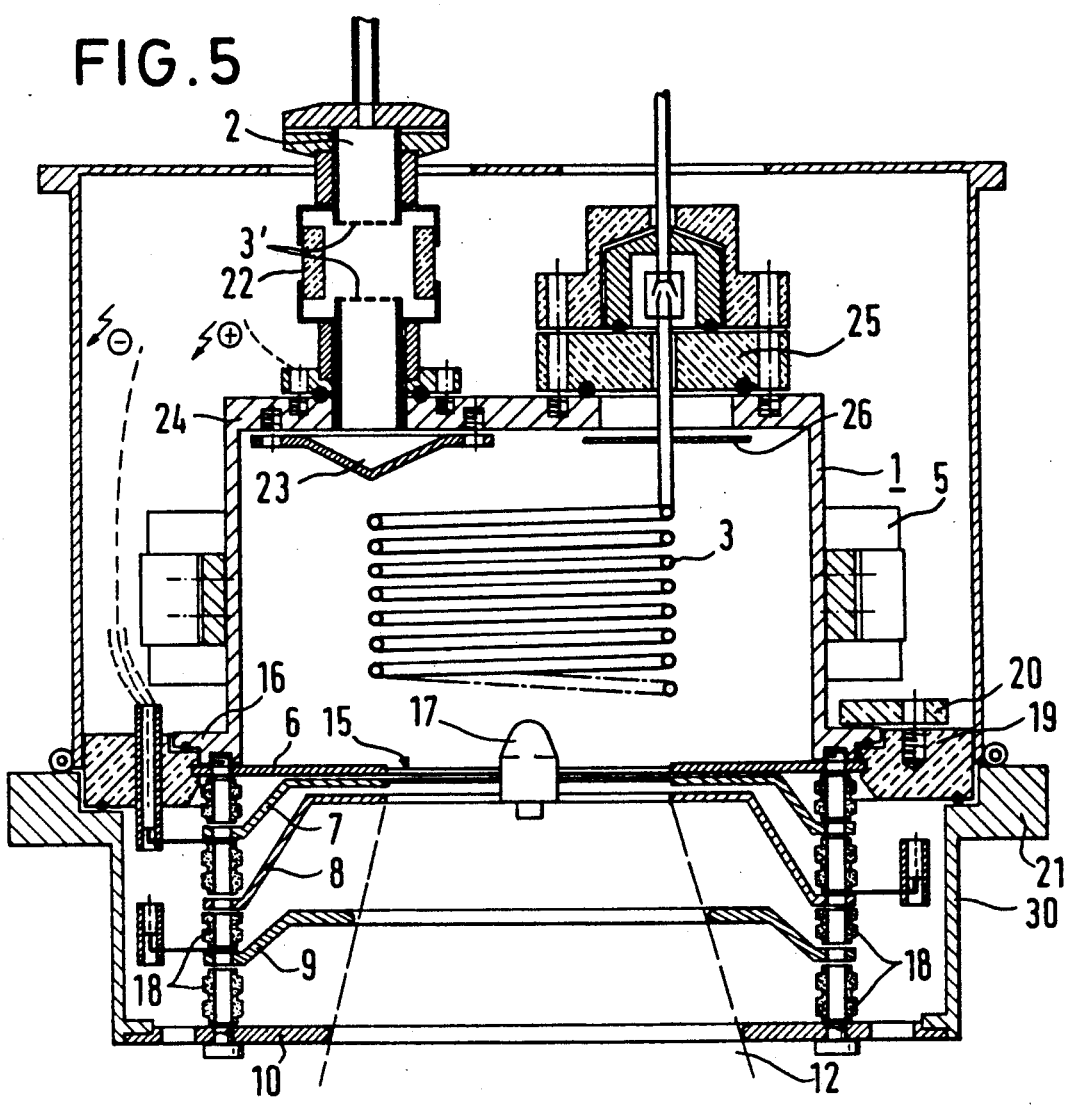

FIG. 5 shows a sectional illustration of an embodiment of a radio frequency ion beam source in accordance with the invention. The ioniser vessel 1 comprises a metal cylinder of 10 cm internal diameter and 6 cm internal height. The wall thickness of the cylindrical part amounts to 2 mm and the wall thickness of the cover 24 amounts to 6 mm. The ioniser vessel 1 lies at a positive beam potential in the range from +10 V to +3000 V and can be provided with a cooling system.

In a brass ring provided with correspondingly milled recesses there are arranged, by way of example, 16 cobalt samarium permanent magnets 5. The magnet carrier ring can be pushed from above onto the ionisation cylinder and screwed to the latter.

The gas supply via an inlet 2 takes place via an easily exchangeable supply container with pressure reduction and a regulatable throughflow measuring device via a small flange connection and a suitable ceramic insulator 22 provided for example, with two steel nets 31 for keeping the potential at a defined level. This gas supply opens in the ioniser vessel 1 in a gas distribution head 23 with an annular outlet gap.

The water-cooled r.f. coil 3 which is coated with an insulating protective layer (a section of which is shown at 3a) consists for example of a 3 mm copper tube and has for example 6⅔rd turns. The connection of the r.f. coil 3 to the associated r.f. generator takes place through the ionisation cover 24 via two passage connectors 25 which, for the purpose of avoiding r.f. losses, are of large area, are vacuum sealed and are protected against metallic deposits via mica-disks 26. The two r.f. passage connectors 25 and the gas supply are preferably arranged on the ioniser cover 24 at the vertices of an equilateral triangle with the centre of the triangle corresponding with the central coil axis.

The beam formation system is secured by the first grid electrode 6 directly to the ioniser vessel 1. The three grid extraction system 6, 7, 8 is specially laid out for very low beam voltages. Over the entire cross-section 15 of for example 5.3 cm diameter the two first grid electrodes 6, 7 are each only 0.5 mm thick and have a spacing of likewise only 0.5 mm. Thus the current determining extraction distance d indicated in FIG. 3 amounts to only 2 mm.

The grid electrodes 6, 7 are thickened for mechanical and thermal reasons to 1.5 mm respectively outside of the extraction surface 15.

All grid electrodes are preferably manufactured of molybdenum with regard to the high electrical and thermal conductivities, the low thermal coefficient of expansion and the high thermal stability as well as the low sputtering rate.

In order to limit thermal misalignment of the grid electrodes a support device or central holder 17 of small spatial dimensions is arranged at the centers of the grids. In order to secure the two first grid electrodes 6, 7 together with the central support 17 in a mechanically stable manner the third grid electrode 8 is made relatively stable over the entire cross-section and is for example formed with a thickness of approximately 2 mm, with the extraction bores being preferably conically tapered or chamfered.

In the variant of the invention shown in FIG. 5 the individual hole diameters of the three grid electrodes 6, 7, 8 are 3 mm, 2 mm and 3.2 mm respectively. At 5.3 cm beam diameter and a width between holes of 1 mm in the first grid electrode 6 one thereby obtains 144 extraction openings. In this respect it should be remarked that the extraction surface can, if required, also be bored out further and approximately 300 extraction openings can be achieved without difficulty.

The ion optic focussing lens which is inserted after the extraction system comprises in addition to the third extraction grid 8 two equidistant stainless steel ring electrodes 9, 10 which are set back at an angle of approximately 15° to the beam axis. That is to say, the radially inner edges of the ring electrodes lie on the surface of an imaginary cone having an included cone angle of two times 15°.

A maximum of four voltage supply units is required for the whole beam forming system, namely for the first grid electrode 6 including the ioniser vessel 1, for the second grid electrode 7, for the third grid electrode 8 and for the first ring electrode 9. The ring electrode 10 which forms the last ion lens electrode lies at earth potential. It is also possible, if required, to directly connect two electrodes to the same voltage source, or to the same voltage source via a potential divider.

The five electrodes 6, 7, 8, 9, 10 are preferably centered by insulators 18 and insulator bolts consisting of Macor, with the insulating bolts being inserted into corresponding bores of the insulator flange 16. The ionisation and beam forming system is secured to the earthed housing 30 via a carrier ring 19 consisting of Macor, glass fiber lugs 20 and the second ring electrode 10. The housing 30 is in turn provided with a flange 21 by means of which the ion source can be flanged onto the associated vacuum chamber from the outside.

Figure 6:
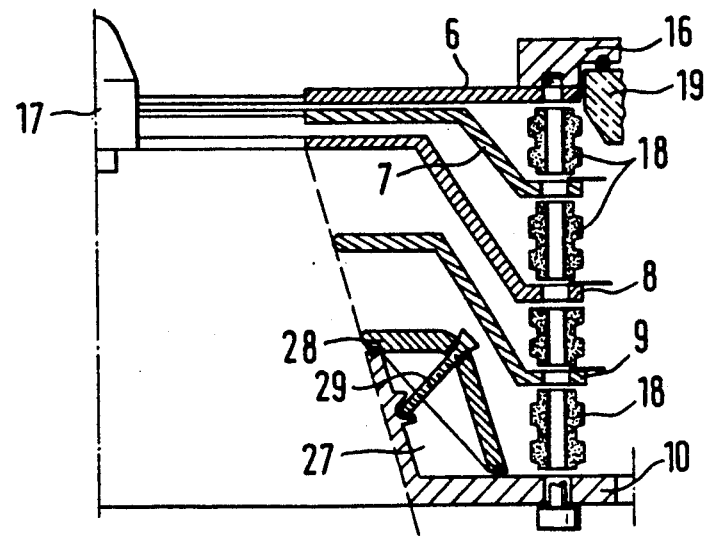

FIG. 6 shows a variant of a radio frequency ion beam source with additional magnetic focussing for very low ion energies. For this purpose a magnetic field coil 27 is provided at the output side and forms a magnetic lens having a field strength which for example lies in the range from 10 to 30 mT and which can be matched to the kinetic ion energy. The magnetic field coil 27 can thereby be mounted between the second ring electrode 10 and a soft iron cover 28, which is secured by means of threaded bolts 29 to the ring electrode 10.

Figure 7:
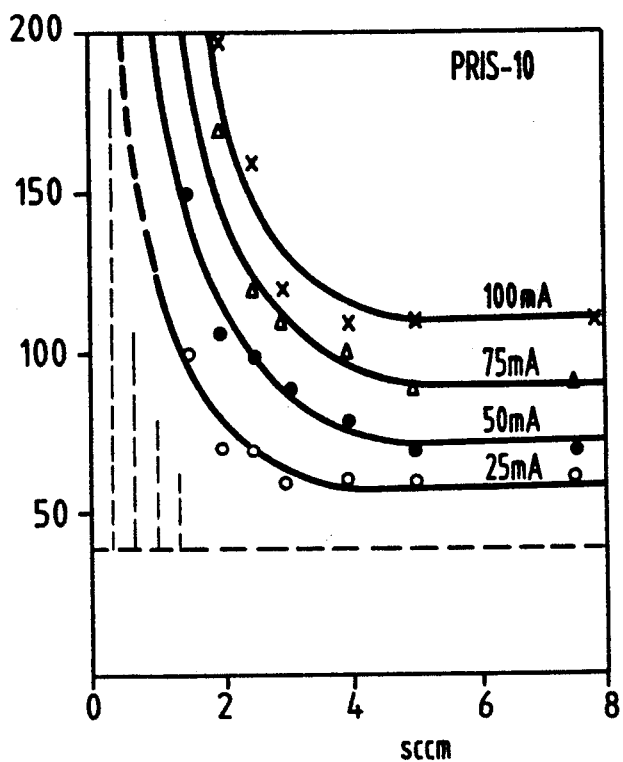

FIG. 7 shows typical discharge characteristics for a high frequency ion beam source in accordance with FIG. 5 when using Argon at 2 MHz. The extracted ion current (as a parameter) is shown in dependence on the high frequency power and the gas throughput. The r.f. eddy current loss of 40 W for the ion current source results as the horizontal boundary line for the current zero. The vertical asymptotes are shown by the theoretical 100% gas economy. Notable is the very high ion yield (beam density per unit of r.f. power) which is approximately twice as high as that of customary devices. For corresponding r.f. power and gas throughputs total ion currents of over 200 mA can be produced without problem.

In order to extract a specific, desired ion current it is necessary, as shown in FIG. 7, to select the r.f. power and the gas flow rate so that both are matched to one another. Moreover, the necessary extraction voltage must be applied, as can be seen from FIG. 8, as the potential difference between the first grid electrode 6 and the second grid electrode 7. Independently of this, the ion energy can be determined by the potential of the first grid electrode 6. The potential of the second grid electrode 7 is then given by the difference of the required extraction voltage and the desired beam voltage. In addition the ion lens has been switched on in addition at low ion energies and conjointly at high current densities.

Figure 8:
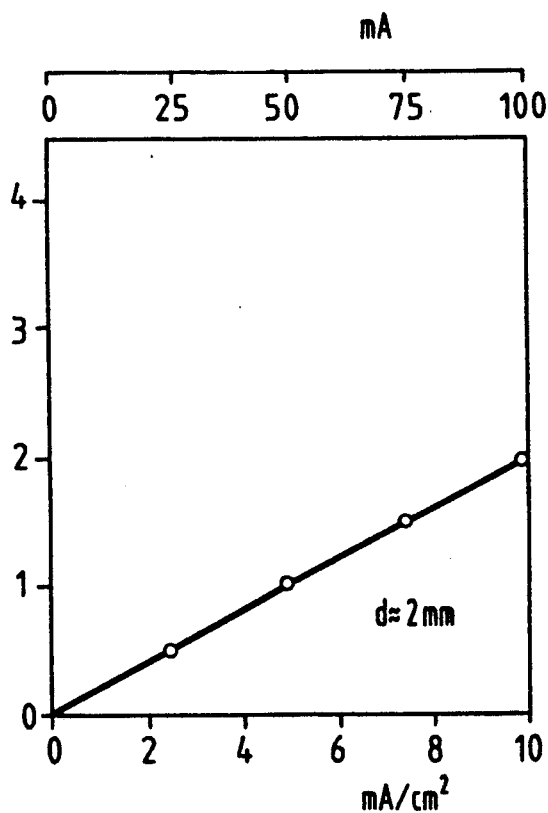

It can furthermore be seen from FIG. 8 that the ion beam source of the invention uses low extraction voltages which clearly lie below the extraction voltages of the customary ion beam source, in particular by a factor 2 to 3.5. Thus, for example, it is already possible to achieve a current density of clearly 5 mA/cm$^2$ with a 1 kV extraction voltage, which is particularly advantageous at low ion energies because the acceleration-deceleration ratio can be held in limits.

The ion optic beam lens at the output of the ion radiation source acts favourably, above all at low ion energies, on the current distribution, the degree of focussing and the beam profile. The quality of the ion beam can be further improved by beam neutralisation at the output side by means of electrons which can be generated at the earthed source output by means of glow filaments which are arranged distributed around the beam. It is also of advantage that the negative potential of the central electrode of the ion lens screens the three grid electrode system against electrons from the neutraliser.

The radio frequency ion beam source in accordance with the invention can be used for a broad variety of ions, including metal ions from gaseous metal compounds and ions of reactive gases, for example $N^+$, $C^+$, $Si^+$, $B^+$, $Ti^+$, $Zr^+$. Furthermore it makes it possible to select continuously adjustable ion current densities between approximately 0.5 mA/cm$^2$ and 10 mA/cm$^2$ with approximately monoenergetic and continuously variable ion energies between approximately 10 eV and 3 keV, even with independently adjustable high current densities. Moreover, the high frequency ion beam source delivers, in the example described here, a beam diameter of about 5 cm, so that one can operate with substrates of the diameter of more than 5 cm. The distance between the ion source and the substrate can lie in the range from 20 cm to 40 cm. Furthermore, the ion beam source of the invention is characterised by a long working life and long intervals between servicing as well as by being easy to handle. This is an advantage, since it can be flanged without problem from the outside onto the respectively associated vacuum chamber in which a pressure can for example exist of $10^{-3}$ to $10^{-2}$ Pa.

By enlarging the reactor chamber and the extraction grid system it is also possible to generate substantially broader beams in different shapes. With suitable geometry of the extraction system the beams can either be circular or oval or even stripe-like as if they were emerging from a slot. The divergence of the beam can also be selected as desired by means of a suitable ion optic and extraction grid geometry.

As previously indicated the radio frequency ion beam source of the present application can be operated in such a way that the current density, which is dependent on the RF power supplied to the coil and on the extraction voltage, i.e. the potential difference between the first and second grid electrodes, and the ion energy, which depends on the potential of the first grid electrode, are variable independently from one another.

The ion focussing unit is generally switched on when the ion energy falls below the value of approximately 1000 eV, and in particular below a value of approximately 300 eV. switched on if the ion energy falls below about 500 eV.

When the radio frequency ion source is used with a substrate having at least one insulating surface then a space charge compensation is always effected by means of the aforementioned beam neutralizer.

With ion energies below 500 eV a space charge compensation is again usefully effected by means of the beam neutralizer.

With a system which operates above 3000 eV, which is basically possible, an additional acceleration system is arranged following the ion beam extraction system at a predeterminable spacing.

The radio frequency ion beam source of the present application is especially used for the surface treatment of a substrate, which surface treatment normally comprises a first step of surface preparation and a subsequent step of deposition of at least one layer of material having a good adhesion to said substrate, whereby both said surface preparation step and said subsequent deposition step are done one after the other with a continuous transition from said first step to said subsequent step, with an optimum ion energy and an optimum ion current density being used for each said step.

Finally it should be pointed out that it is possible to make simultaneous use of several radio frequency ion beam sources in accordance with the present invention for the deposition of alloys and chemical compounds. Thus, a plurality of radio frequency ion beam sources can be simultaneously used to deposit ions of constituent elements of an alloy or chemical compound onto a substrate, with the ion beam densities and ion energy being suitably selected to deposit said alloy or chemical compound comprising said constituent elements on said substrate.

REFERENCE NUMERAL LIST

Ioniser vessel
Gas inlet
R.f. coil
R.f. generator
Permanent magnets
First grid electrode (extraction anode)
Second grid electrode (extraction cathode)
Third grid electrode (braking grid)
First ring electrode (ion lens)
Second ring electrode (ion lens)
High voltage generators
Ion beam
Plasma
Plasma boundary
Extraction surface
Ioniser flange
Support
Insulator elements
Carrier ring
Clamping elements
Mounting flange
Ceramic insulator
Gas distribution inlet
Ioniser cover
Coil feed-through
Shadow screen
Magnet coil
Soft iron material
Bolt
Housing
Steel nets

We claim:
1. A radio frequency ion beam source for producing an ion beam of a desired energy and current density, said ion beam source comprising a metallic conductive ioniser vessel having an interior, means for feeding a working gas to be ionised into said ioniser vessel; a radio frequency coil disposed coaxially within the interior of said ioniser vessel; a radio frequency source connected to said radio frequency coil for generating a plasma in said ioniser vessel by an inductively generated discharge, said plasma being a non-isothermal plasma of ions, electrons and neutral gas particles; and a beam forming system comprising a combination of a plurality of multi-hole extraction grids and an ion focussing unit which directly follows them; and means for selectively switching on said ion focussing unit.

2. A radio frequency ion beam source in accordance with claim 1 wherein said ionizer vessel comprises chemically resistant stainless and non-magnetic metal, and said source further comprises means for placing said ioniser vessel at a positive beam potential capable of being varied within a range from approximately +10 V to +3000 V and means for supplying a cooling fluid to said ioniser vessel.

3. A radio frequency ion beam source in accordance with claim 1, wherein said radio frequency coil consists of a copper tube through which a cooling medium can flow, said copper tube being coated with an insulating protective layer.

4. A radio frequency ion beam source in accordance with claim 1 wherein said ioniser vessel comprises a metal cylinder with a cover formed in one part, a connection flange provided at an end of said cylinder remote from said cover, and feed connections for said radio frequency coil, said feed connections passing through said cover; wherein insulators for said feed connections are provided on or in said cover, there being inwardly disposed protective screens to shade said insulators against the deposition of metal thereon; wherein a gas inlet is provided in said cover and is provided with a distributor inlet inside said ioniser vessel; and wherein both said beam forming system and a mounting flange associated with said beam forming system are fixed to said connection flange, with insulating intermediate construction parts being provided between said mounting flange and said connection flange, said mounting flange permitting said ioniser vessel to be flanged onto an associated vacuum chamber from an outside of said vacuum chamber.

5. A radio frequency ion beam source in accordance with claim 1 wherein said ioniser vessel has a metallic jacket and wherein a ring of permanent magnets of alternating polarity is mounted at said metallic jacket of said ioniser vessel for concentration of said plasma and for reduction of discharge losses at wall means of said ioniser vessel.

6. A radio frequency ion beam source in accordance with claim 1, wherein said plurality of multi-hole extraction grids comprises a three grid extraction system having first, second and third grid electrodes connected to said ioniser vessel; wherein said grid electrodes are mutually insulated, with said first and second grid electrodes having a respective thickness dimension and a mutual spacing smaller than 1 mm; and wherein a central support holder is provided to fix said mutual spacing of the first and second grid electrodes.

7. A radio frequency ion beam source in accordance with claim 6, wherein said first and second grid electrodes have a thickness of approximately 0.5 mm or less and said mutual spacing is of corresponding size over an ion beam extraction area; and wherein said third grid electrode has a thickness over its entire cross-section which is somewhat larger than said thickness of said first and second grid electrodes, said third grid electrode serving as a support for said central support holder.

8. A radio frequency ion beam source in accordance with claim 7 wherein said grid electrodes are of thermally stable shape and are temperature resistant, wherein said grid electrodes each have a plurality of extraction bores for said ion beam, the extraction bores in each of said grid electrodes having a respective diameter, and wherein the respective diameter of said extraction bores in each of said grid electrodes differs in size from the respective diameter of the extraction bores in the other grid electrodes.

9. A radio frequency ion beam source in accordance with claim 1 wherein said radio frequency coil has a diameter and said multi-hole extraction grids forming part of said beam forming system has an ion beam extraction area having a diameter, said diameter of said radio frequency coil being substantially equal to said diameter of said ion beam extraction area.

10. A radio frequency ion beam source in accordance with claim 1 wherein said plurality of multi-hole extraction grids comprises a three grid system having first, second and third grid electrodes and wherein said ion focussing unit comprises an ion optical focussing lens formed by said third grid electrode and first and second ring electrodes having radially inner edges, said radially inner edges of said ring electrodes lying on an imaginary conical surface having a central axis.

11. A radio frequency ion beam source in accordance with claim 10 wherein said first and second ring electrodes are of thermally stable shape and temperature resistant and have at least substantially the same spacing from one another as said third grid electrode has from said first ring electrode, said first ring electrode being adjacent to said third grid electrode.

12. A radio frequency ion beam source in accordance with claim 1 and further comprising a magnetic lens having a field strength matched to said ion energy and arranged proximate an outlet of said source to assist the bundling of said beam.

13. A radio frequency ion beam source in accordance with claim 1 wherein a beam neutralizer comprising at least one glow filament is provided adjacent an output of said source, or within said ion focussing unit, for the injection of electrons into said ion beam.

14. A radio frequency ion beam source in accordance with claim 1 wherein means is provided for directly or indirectly cooling said ioniser vessel by a cooling medium.

15. A method of operating a radio frequency ion beam source for producing an ion beam of a desired ion energy, and current density, said ion beam source comprising a metallic conductive ioniser vessel having an interior, means for feeding a working gas to be ionised into said ioniser vessel; a radio frequency coil disposed coaxially within the interior of said ioniser vessel; a radio frequency source connected to said radio frequency coil for generating a plasma in said ioniser vessel by applying radio frequency power to said radio frequency coil to produce an inductively generated discharge, said plasma being a non-isothermal plasma of ions, electrons and neutral gas particles; and a beam forming system comprising a combination of a plurality of multi-hole extraction grids and an ion focussing unit which directly follows them; and means for selectively switching on said ion focussing unit, wherein said current density, which is dependent on said radio frequency power supplied to said coil and on an extraction voltage, i.e. the potential difference between a first and second grid electrodes, and said ion energy, which is dependent on a potential applied to the first one of said multi-hole extraction grids, are varied independently from one another.

16. A method in accordance with claim 15 wherein said ion focussing unit is switched on when said ion energy falls below approximately 1000 eV.

17. A method in accordance with claim 15 wherein a post focussing device comprising at least one magnetic coil arranged between said ion focussing unit and a substrate is switched on when said ion energy falls below about 500 eV.

18. A method in accordance with claim 15 and comprising the further step of effecting a space charge compensation by means of a beam neutralizer when operating with a substrate having at least one insulating surface.

19. A method in accordance with claim 15 and comprising the further step of effecting a space charge compensation by means of a beam neutralizer when said ion energy is below 500 eV.

20. A radio frequency ion beam source in accordance with claim 1 wherein, for an ion energy above 3000 eV, an acceleration system is arranged following said ion focussing unit at a predetermined space therefrom.

21. Method of using a radio frequency ion beam source for treatment of a substrate, said ion beam source comprising a metallic conductive ioniser vessel having an interior, means for feeding a working gas to be ionised into said ioniser vessel; a radio frequency coil disposed coaxially within the interior of said ioniser vessel; a radio frequency source connected to said radio frequency coil for generating a plasma in said ioniser vessel by an inductively generated discharge, said plasma being a non-isothermal plasma of ions, electrons and neutral gas particles; and a beam forming system comprising a combination of a plurality of multi-hole extraction grids and an ion focussing unit which directly follows them; and means for selectively switching on said ion focussing unit, the method comprising a first step of surface preparation and a subsequent step of deposition of at least one layer of material having a good adhesion to said substrate, whereby both said surface preparation step and said subsequent deposition step are done one after the other with a continuous transition from said first step to said subsequent step, with an optimum ion energy and an optimum ion current density being used for each said step.

22. Method in accordance with claim 21 in combination with a substrate comprising crystals or crystallites, said crystals having a crystal structure and crystal orientation and said crystallites having a texture and a shape, wherein said first step comprises at least one of the following substeps:
  (a) a surface of said substrate is cleaned and partially eroded by ion beam etching using an appropriately chosen ion energy and ion current density,
  (b) a surface of said substrate is heated and degassed by means of an ion beam of low ion energy and current density greater than 1 mA/cm2,
  (c) a surface of said substrate is roughened by ion bombardment to produce craters and grooves for mechanical anchoring of a layer of material to be subsequently deposited thereon;
and wherein said subsequent step comprises at least one of the following substeps:
  (d) ions of energy greater than 50 keV but with an ion beam of low current density, are implanted into said substrate to a depth of a plurality of atomic planes into said crystallites of said substrate and into interstitial spaces between crystal atoms of said substrate and optionally into interspaces of said crystallites, whereby to initiate interdiffusion of atoms;
  (e) layers of metals, alloys or chemical compounds are built up on a surface of said substrate using ions of said metals, alloys or chemical compounds, with an optimum ion energy and an optimum ion beam density being selected in dependence on said texture and shape of said crystallites; and
  (f) layers of metals, alloys or chemical compounds are built up on a surface of said substrate using an optimum ion energy and an optimum ion current density selected in dependence on said structure and orientation of said crystals.

23. Method in accordance with claim 21, comprising using a plurality of radio frequency ion beam sources to simultaneously deposit ions of constituent elements of an alloy using suitably selected ion beam densities and ion energies to deposit said alloy comprising said constituent elements on said substrate.

24. Method in accordance with claim 21, comprising using a plurality of radio frequency ion beam sources to simultaneously deposit ions of constituent elements of a chemical compound using suitably selected ion beam densities and ion energies to deposit said chemical compound comprising said constituent elements on said substrate.

25. A Radio frequency ion beam source in accordance with claim 3 wherein said insulating protective layer comprises a woven quartz fibre cover.

26. A Radio frequency ion beam source in accordance with claim 3 wherein said insulating protective layer comprises glass coating.

27. A Radio frequency ion beam source in accordance with claim 4 wherein said ioniser vessel has an axis and wherein said insulators for said feed connections are uniformly displaced relative to one another and to said vessel axis.

28. A Radio frequency ion beam source in accordance with claim 5 wherein said ring of permanent magnets is coaxially arranged relative to said ioniser vessel and to said radio frequency coil.

29. A Radio frequency ion beam source in accordance with claim 8 wherein said grid electrodes comprise molybdenum.

30. A Radio frequency ion beam source in accordance with claim 8 wherein said grid electrodes comprise stainless steel.

31. A Radio frequency ion beam source in accordance with claim 8 wherein said extraction bores comprise conically tapering bores.

32. A Radio frequency ion beam source in accordance with claim 8 wherein said respective diameters of said extraction bores in said first, second and third grid electrodes are 3 mm, 2 mm and 3.2 mm respectively.

33. A Radio frequency ion beam source in accordance with claim 10 wherein said conical surface diverges away from said ioniser vessel and has an acute angle of about 15° with respect to said central axis.

34. A Radio frequency ion beam source in accordance with claim 11 wherein said third grid electrode and said ring electrodes comprise stainless steel or molybdenum.

35. A Radio frequency ion beam source in accordance with claim 13 wherein said source output is grounded.

36. A Radio frequency ion beam source in accordance with claim 10 wherein said grid electrodes and said ring electrodes comprise a metal and are directly or indirectly cooled by a cooling medium.

37. A Radio frequency ion beam source in accordance with claim 12 wherein said magnetic lens is directly or indirectly cooled by a cooling medium.

38. A method in accordance with claim 16 wherein said ion focussing unit is switched on when said ion energy fall below approximately 300 V.

* * * * *